(12) United States Patent
Crapisi et al.

(10) Patent No.: US 6,487,082 B1
(45) Date of Patent: Nov. 26, 2002

(54) PRINTED CIRCUIT BOARD COMPONENT PACKAGING

(75) Inventors: Thomas Alex Crapisi, Jim Falls; Jeffrey S. Conger, Eau Claire; Stephen Cermak, III, Elk Mound; Stephen A. Bowen, Chippewa Falls; Rodney Ruesch, Eau Claire; David Paul Gruber, Mondovi; Bonnie Kay Dobbs, Bloomer, all of WI (US)

(73) Assignee: Silicon Graphics, Inc., Mountain View, CA (US)

( * ) Notice: Subject to any disclaimer, the term of this patent is extended or adjusted under 35 U.S.C. 154(b) by 5 days.

(21) Appl. No.: 09/620,059

(22) Filed: Jul. 20, 2000

(51) Int. Cl.[7] .................................................. H05K 7/10
(52) U.S. Cl. ........................ 361/760; 361/761; 361/764; 361/784; 174/260; 174/261
(58) Field of Search ................................ 361/760, 761, 361/764, 784; 174/260, 261

(56) References Cited

U.S. PATENT DOCUMENTS

| | | | |
|---|---|---|---|
| 4,216,523 A | | 8/1980 | Harford ....................... 361/393 |
| 4,926,546 A | | 5/1990 | Polczynski et al. ........... 29/840 |
| 5,325,267 A | * | 6/1994 | Ewing ......................... 361/760 |
| 5,525,763 A | | 6/1996 | Van Liere ................... 174/263 |
| 5,659,459 A | * | 8/1997 | Wakabayashi et al. ...... 361/753 |
| 5,701,233 A | * | 12/1997 | Carson et al. .............. 361/735 |
| 5,731,231 A | * | 3/1998 | Miyajima .................... 438/124 |
| 6,021,048 A | * | 2/2000 | Smith .......................... 361/736 |
| 6,160,718 A | * | 12/2000 | Vakilian ...................... 361/803 |
| 6,320,750 B2 | * | 11/2001 | Shaler et al. ............... 361/736 |

* cited by examiner

Primary Examiner—David Martin
Assistant Examiner—Thanh Y. Tran
(74) Attorney, Agent, or Firm—Schwegman, Lundberg, Woessner & Kluth, P.A.

(57) ABSTRACT

A printed circuit board apparatus, configurations and methods are presented which provide for close spacing between the HUB and multiple processors as well as a common configuration for two or four processor boards. A printed circuit board is provided with conductive apertures and portions corresponding to an efficient Packaging allowing for the attachment of the processor-chip on one side of the printed circuit board, and the HUB and other supporting electronic components on the other side of the printed circuit board. This configuration allows for the close spacing of the electrical conductors of the HUB and the processors without the limitations imposed by the physical dimensions of the respective hardware. Additionally, a symmetric packaging of the conductive apertures and portions about a centerline of the printed circuit board allows for a simple design modification to allow for a two two-processor board to be manufactured from a similarly configured four-processor board.

20 Claims, 4 Drawing Sheets

PRINTED CIRCUIT BOARD COMPONENT PACKAGING

CROSS-REFERENCE TO RELATED INVENTION

The present invention is related to the following application, which is filed on even date herewith, and which is incorporated herein by reference:

U.S. patent application Ser. No. 09/620,178, filed Jul. 20, 2000, titled "MEMORY DAUGHTER CARD APPARATUS, CONFIGURATIONS, AND METHODS".

TECHNICAL FIELD OF THE INVENTION

The present invention relates generally to the field of printed circuit boards, and, more particularly, to component packaging on a printed circuit board.

BACKGROUND

Modern high performance computers contain a number of printed circuit boards (PCB) to carry and interconnect the various integrated circuit chips and other components that make up the computer system. Computers may be configured to have one or more subsystems, each in its own right a computer, that are interconnected into a larger, greater capacity computer. Each subsystem may contain basically the same components assembled in a chassis. Within a given subsystem, there may be, among others, a processor board, a power board, and any number of secondary or daughter boards that are carried upon a support structure within the subsystem chassis. These subsystems of boards are carried in racks in the computer chassis.

Processor boards are so named as they contain one or more processors, or central processing units (CPU). The CPU is an integrated circuit (IC) chip that is considered the "brains" of the computer. The processor board serves as a communication medium for the exchange of electrical signals among the one or more attached processors and other electrical components attached to the processor board, daughter cards, and other components. The processor board is commonly referred to as a backplane, mother board, system board, or mainboard, depending on its finction and configuration.

The processor board is a printed circuit board. A PCB is a relatively thin, flat sheet structure. The PCB may be made of laminations of reinforced fiberglass or plastic and metallic interconnects which electrically link the components attached to the board.

Processor boards contain one or more processors. Some processors are actually an assembly consisting of a processor module and a power conditioning module. These assemblies are relatively large, taking up considerable surface area of the processor board. Even though the assembly's corresponding electrical contact pins require considerably less PCB surface area, the physical dimension of the assembly requires considerable PCB surface area if attached to the PCB using conventional methods. Careful placement consideration of other components is also a factor, considering that component to component distances must be minimized.

Additionally, for a given printed circuit board size, the large processor assemblies take up considerable surface area of the board. In some cases, components which are typically attached to the PCB in close proximity to the processor, are moved to other locations on the board or moved entirely off the board onto daughter boards. As a consequence, the distances between electrical components become large which is detrimental to the performance of the system as a whole.

Another electronic component attached to the processor board is an IC chip set commonly known as the HUB. The HUB controls the computer's electrical components such as, among others, the one or more processors, the memory, and the communication between other PCBs and to external peripherals. In the recent past, processor board configurations provided for one processor controlled by one HUB. In order to increase the performance of a computer, designers have added additional processors on a single processor board creating multiple processor computers. A limitation to a computer's performance, among others, is caused by the distance between electrical components, and in particular, the distance between the HUB and the one or more processors. As these distances become greater, the performance of the computer is compromised.

Another consideration in computer processor board design is in the cost of manufacture. The cost of tooling and producing PCB's of different sizes and configurations is a cost burden. The PCB designer is economically encouraged to design PCB which require a minimal amount of retooling.

There is a need in the art for a PCB configuration of the electrical components to minimize the distance between the HUB and the one or more processors. Further, there is a need for a PCB configuration such that PCB utilization of surface area is maximized for a given PCB size. Additionally, there is a need for a PCB configuration that can be economical to produce for different computer configurations using substantially the same PCB configuration, to provide for economy of manufacturing. The packaging of such assemblies requires consideration of cooling, power, mechanical placement, electrical specification and cost. The overwhelming size of the new generation of processors compared with previous generations of processors presents a unique challenge to PCB configuration and packaging.

For the reasons stated above, and for other reasons stated below which will become apparent to those skilled in the art upon reading and understanding the present specification, there is a need in the art for an improved method of PCB component configuration to address the challenges of minimizing the distance between electrical components and to relieve manufacturing cost burdens.

SUMMARY

The above-mentioned disadvantages associated with large processors mounted on printed circuit boards, and other disadvantages, are addressed by the present invention and will be understood by reading and studying the following specification.

New apparatus, methods and configurations are provided that allows for a minimizing interconnect distances between the HUB and the one or more processors. The configuration and methods include placing the processors on one side of the processor board and the HUB placed on the opposite side of the processor board and in close proximity to the processor electrical leads. This enables the interconnection distance between the processor leads and HUB leads to be minimized and not restricted by the physical size of the processor and HUB housings.

In particular, an illustrative embodiment of the present invention includes a printed circuit board (PCB) having a plurality of apertures piercing through the PCB, wherein electrical leads of electrical components may pass through and be soldered. The PCB has a top surface and a bottom surface. The pattern of apertures on either side is substantially the same as the apertures pierce through the PCB. A plurality of groupings of apertures corresponding to the electrical lead patterns of larger electronic components are provided. Specifically, two HUB-chip conductive portions are provided, each HUB-chip conductive portion adapted to receive a HUB-chip. Additionally, four processor-chip conductive portions are provided. Each processor-chip conductive portion is adapted to receive a processor-chip. Two processor-chip conductive portions are disposed on opposite sides of each HUB-chip conductive portion in a symmetrical, mirror image arrangement.

Each processor-chip conductive portion has a plurality of terminating resistor conductive portions positioned around three sides of the processor-chip conductive portion. Terminating resistor conductive portions are adapted for the attachment of terminating resistors.

Two HUB-chips, a plurality of terminating resistors, and various other electronic and mechanical components are attached to one side of the PCB. Four processor assemblies are attached to the converse side of the PCB.

In one embodiment of the present invention, the apertures and conductive portions on the left half of the PCB are a mirror image of the apertures and conductive portions on the PCB right half. In one embodiment of the invention for a PCB adapted for four processors, a plurality of electrical paths between the PCB left half and the PCB right half are provided for necessary electronic exchange.

In another embodiment of the present invention, the PCB is adapted to be severed about the junction of the left half and the right half of the PCB. The PCB does not have interconnected electrical paths between the left and right halves of the PCB, allowing for the PCB to be severed to produce two two-processor printed circuit boards.

DETAILED DESCRIPTION

The following detailed description refers to the accompanying drawings which form a part of the specification. The drawings show, and the detailed description describes, by way of illustration, specific illustrative embodiments in which the invention may be practiced. These embodiments are described in sufficient detail to enable those skilled in the art to practice the invention. Other embodiments may be used and mechanical changes may be made without departing from the scope of the present invention. The following detailed description is, therefore, not to be taken in a limiting sense. Like reference numbers refer to similar items in all the figures.

Figure 1:
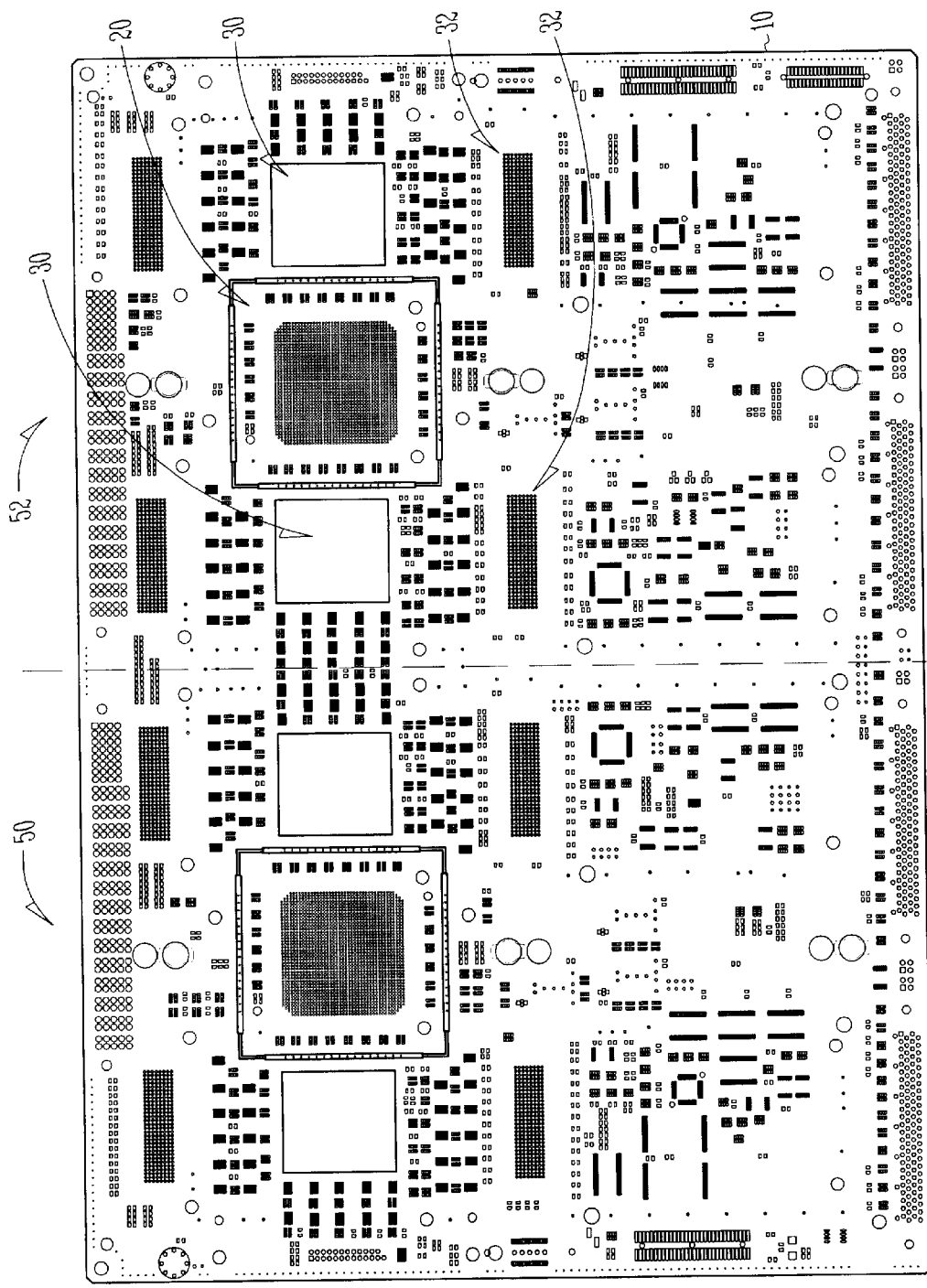
FIG. 1 illustrates a printed circuit board in accordance with one embodiment of the invention.

FIG. 1 depicts a printed circuit board (PCB) 10 in accordance with one embodiment of the present invention. Printed circuit board 10 is a multi layer flat, plate-like structure having external dimensions adapted to support attached electrical component or components, which will be described subsequently. Visible in the illustration is a plurality of apertures piercing through PCB 10 wherein electrical leads of electrical components may pass through. The apertures have an electrically conductive property such that electrical connections between the pins of the electronic components can communicate with the conductive paths in and on PCB 10. The electrical leads of most electronic components are soldered to PCB 10 from the opposite of PCB 10.

In accordance with the embodiment of FIG. 1, PCB 10 has a top surface and a bottom surface. The pattern of apertures on either side is substantially the same as the apertures pierce through PCB 10. A plurality of groupings of apertures is visible in FIG. 1 corresponding to the electrical lead patterns of larger electronic components. Two HUB-chip conductive portions 20 are provided, each HUB-chip conductive portion 20 is adapted to receive a HUB-chip set. Four processor-chip conductive portions 30 are provided. Each processor-chip conductive portion 30 is adapted to receive a processor-chip. Two processor-chip conductive portions 30 are disposed on either side of HUB-chip conductive portion in a symmetrical mirror arrangement.

Each processor-chip conductive portion 30 has a plurality of terminating resistor conductive portions 32 positioned around three sides of processor-chip conductive portion 30. Terminating resistor conductive portions 32 are adapted for the attachment of terminating resistors. Terminating resistors are used, among others, as part of the integrated circuit interconnection structure of the processor. The interconnections between integrated circuit devices are a source of signal loss, signal distortion and power dissipation. It is principally the capacitances involved with the interconnection between integrated circuit devices that cause such disadvantages. By utilizing a terminating resistor as part of a series load with the corresponding integrated circuit device and matching the resistor value to the characteristic impedance of the PCB, the disadvantages stated above are minimized. The significance of the terminating resistors according to the present invention, is presented subsequently.

Figure 2:
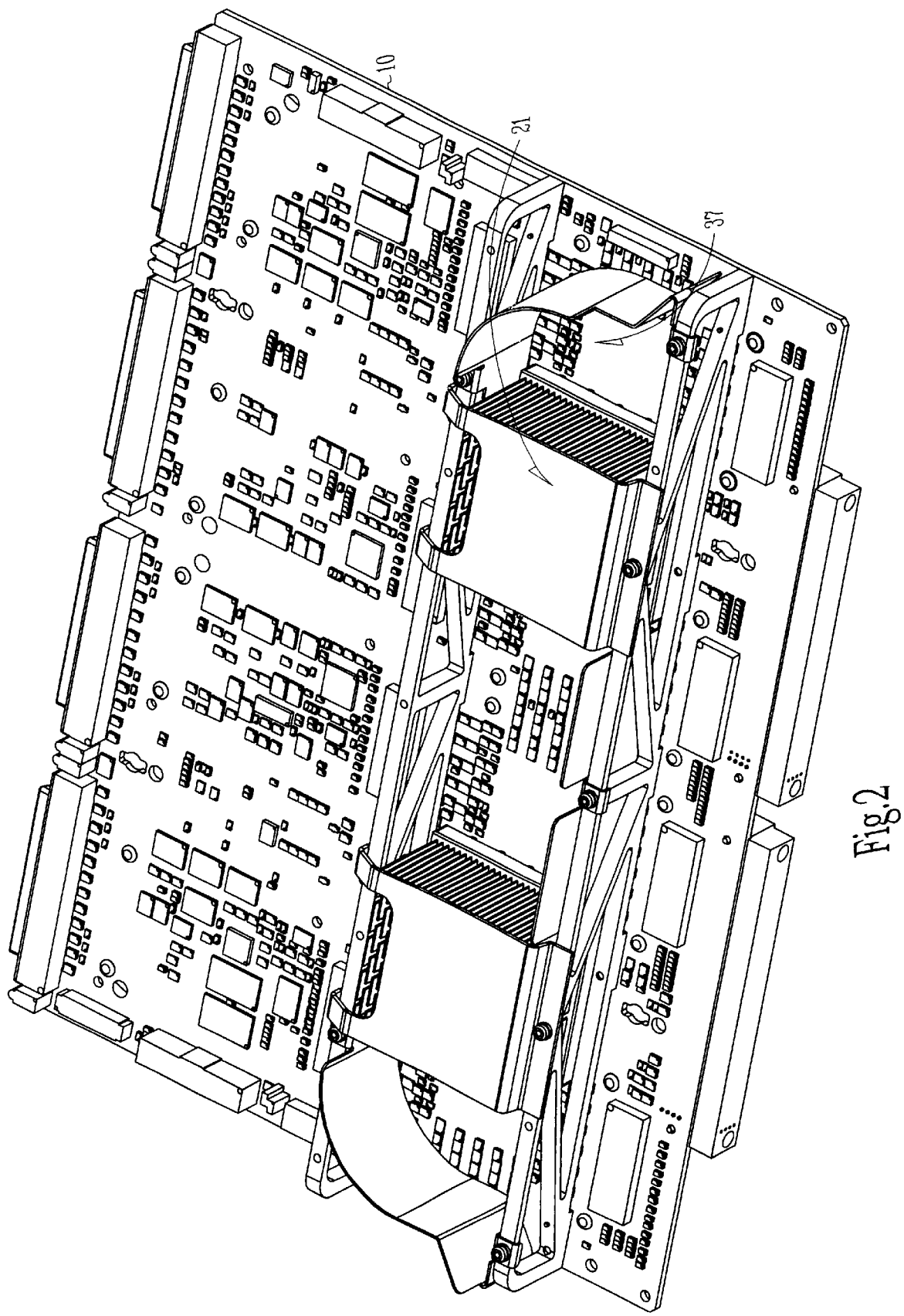
FIG. 2 illustrates a top view of a printed circuit board with attached electronic components in accordance with the embodiment of FIG. 1.
Figure 3:
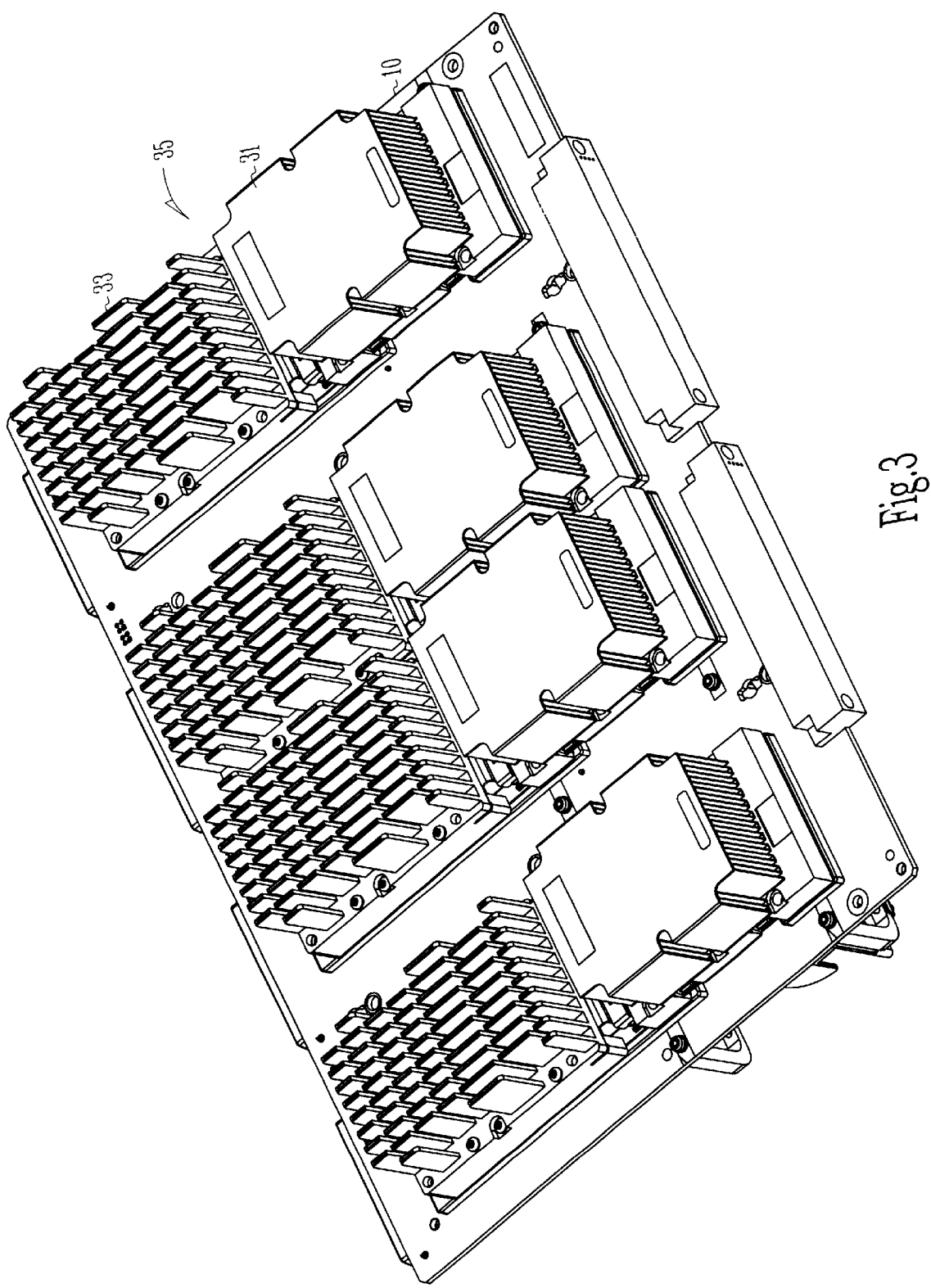
FIG. 3 illustrates a bottom view of a printed circuit board with attached electronic components in accordance with the embodiment of FIG. 1.

FIGS. 2 and 3 illustrate a PCB populated with electronic components, in accordance with one embodiment of the present invention. FIG. 2 is a top view of PCB 10. Visible in the illustration are two attached HUB-chips 21, a plurality of terminating resistors 37 and various other electronic and mechanical components.

FIG. 3 is a bottom view of PCB 10 in accordance with the embodiment of FIG. 2. Visible in the illustration are four processor assemblies 35, each processor assembly consisting of a processor-chip 31 and a power conditioning module 33. The placement of processor assembly 35 on the bottom side of PCB 10 and HUB-chips 21 on the top side of PCB 10 allows an efficient packaging of the electronic components on PCB 10. The close proximity of the HUB-chip conductive portions 20 to processorchip conductive portions 30 allow for a very short distance for HUB-chip 21 to communicate with the processors. This close proximity would not be possible if HUB-chip 21 and the processors were positioned on the same side of PCB 10 due to the physical dimensions of the components and the associated heatsinks.

In operation, each HUB 21 controls the two adjacent processors 31.

Figure 4:
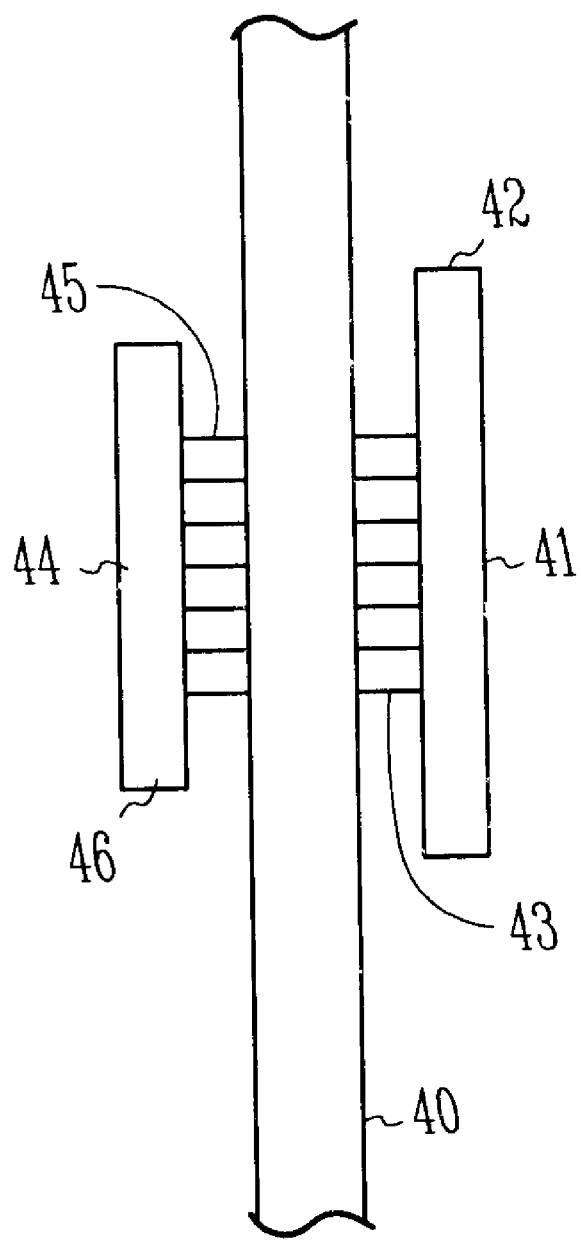
FIG. 4 illustrates a side view of a printed circuit board with attached electronic components in accordance with one embodiment of the present invention.

Illustrated in FIG. 4 is a side-view, in accordance with one embodiment of the invention, of PCB 40, processor 41 with processor connecting leads 43, and HUB-chip 44 with HUB-chip connecting leads 45 and HUB-chip body 46. Processor 41 includes a processor body 42. It can be seen that the width of processor body 42 is larger than the width of processor connecting leads 43. Similarly, it can be seen that the width of HUB-chip body 46 is larger than the width of HUB-chip connecting leads 45. The physical dimensions of HUB-chip body 46 and processor body 42 would not allow for the close proximity of the corresponding connectors if they were to be located on the same side of the PCB. In an embodiment of the present invention, locating processor 41 on the opposite side of PCB 40 from HUB-chip 44, enables HUB-chip connecting leads 45 and processor connecting leads 37 to be in close proximity to each other. This configuration provides for a very short interconnect distance, and correspondingly provides for improved performance for the computer system.

In the illustrated embodiments of FIGS. 1, 2 and 3, processor board 10 is a modified McKinley (Intel Corporation, Santa Clara, Calif.) protocol processor board. It can be seen in FIG. 3 that four processor assemblies 35, which are McKinley processor assemblies, are coupled to the bottom side of PCB 10. Because of the physical size of processor assemblies 35, undesirably long distances between processor 31 and terminating resistors 37 would result if terminating resistors 37 were placed on the same side of PCB 10 as processors 31. As illustrated in FIG. 2, two HUB-chips 21 and other components are attached to the top surface of PCB 10. Sufficient space on PCB 10 is provided for attaching terminating resistors 37 in very close proximity to processors 31. In this configuration, and in one embodiment of the present invention, termination resistors 37 have a resistance value of about 56 ohms.

PCB 10 of FIG. 1 is adapted to support four processors 31 and two HUBs 21, according to one embodiment of the invention. It may be desirable for some computer systems, such as small deskside units, for example, to be configured with two processors. The cost of retooling to accommodate a different PCB design for each configuration is significant. To minimize these costs, according to an embodiment of the present invention, the configuration of apertures and conductive portions on PCB 10 are such that two, two-processor PCBs can be manufactured from a four-processor PCB 10.

As illustrated in the embodiment of FIG. 1, the apertures and conductive portions of PCB left side 50 is a mirror image of the apertures and conductive portions on PCB right side 52. In one embodiment of the invention, a four processor PCB 10 will have a plurality of electrical paths between PCB left side 50 and PCB right side 52 for necessary electronic exchange.

In another embodiment of the present invention, PCB 10 will not have electrical paths between PCB left side 50 and PCB right side 52. PCB left side 50 and PCB right side 52 will be severed to produce two PCBs adapted to support two processors 31. The economy of producing both a two-processor board and a four- processor board from substantially similar board configurations is considerable.

Conclusion

Although specific embodiments have been illustrated and described herein, it will be appreciated by those of ordinary skill in the art that any arrangement which is calculated to achieve the same purpose may be substituted for the specific embodiment shown. This application is intended to cover any adaptations or variations of the present invention.

What is claimed is:

1. A printed circuit board comprising:

a processor board including an upper surface and a lower surface;

a HUB-chip conductive portion on the upper surface of the processor board; and a first processor-chip conductive portion on the lower surface of the processor board, the first processor-chip conductive portion being electrically coupled to the HUB-chip conductive portion, a second processor-chip conductive portion on the lower surface of the processor board, wherein the second processor-chip conductive portion is at least partially positioned opposite to the HUB-chip conductive portion to minimize the distance between the HUB-chip conductive portion and the second processor-chip conductive portion; wherein the first processor-chip conductive portion and the second processor-chip conductive portion are symmetrically positioned relative to the HUB-chip conductive portion.

2. The printed circuit board of claim 1 further comprising:

a HUB coupled to the HUB-chip conductive portion; and a processor coupled to the first processor-chip conductive portion.

3. The printed curcuit board of claim 1 wherein the first processor-chip conductive portion is positioned on the lower surface of the processor board such that the first processor-chip conductive portion is least partially positioned opposite to the HUB-chip conductive portion to minimize the distance between the HUB-chip conductive portion and the first processor-chip conductive portion.

4. The printed circuit board of claim 3 further comprising a resistor conductive portion mounted on the upper surface of the processor board, the resistor conductive portion being electrically coupled to the first processor-chip conductive portion.

5. The printed circuit board of claim 4 further comprising a resistor mounted to the resistor conductive portion.

6. The printed circuit board of claim 4 wherein the resistor conductive portion is positioned on the upper surface of the processor board such that the resistor conductive portion is adjacent to the HUB-chip conductive portion.

7. The printed circuit board of claim 6 wherein the resistor conductive portion is positioned on the upper surface of the processor board such that the resistor conductive portion is least partially positioned opposite to the first processor-chip conductive portion to minimize the distance between the resistor conductive portion and the first processor-chip conductive portion.

8. A printed circuit board comprising:

a processor board including a left side and a right side;

a first HUB-chip conductive portion on the left side of the processor board;

a second HUB-chip conductive portion on the right side of the processor board; and a first processor-chip conductive portion on the left side of the processor board, the first processor-chip conductive portion being electrically coupled to the first HUB-chip conductive portion;

a second processor-chip conductive portion on the right side of the processor board, the first processor-chip conductive portion being electrically coupled to the second HUB-chip conductive portion, wherein the first and second processor-chip conductive portions are positioned on a lower surface of the processor board, and the first and second HUB-conductive portions are positioned on an upper surface of the processor board.

9. The printed circuit board of claim 8 further comprising:

a first HUB coupled to the first HUB-chip conductive portion; and a second HUB coupled to the second HUB-chip conductive portion.

10. The printed circuit board of claim 9 further comprising:
- a first processor coupled to the first processor-chip conductive portion; and
- a second processor coupled to the second processor-chip conductive portion.

11. The printed circuit board of claim 8 wherein the first HUB-conductive is electrically coupled to the second HUB-conductive portion.

12. The printed circuit board of claim 8 wherein the first HUB-chip conductive portion is electrically isolated from the second HUB-conductive portion.

13. The printed circuit board of claim 8 wherein the first HUB-chip conductive portion and the first processor-chip conductive portion are positioned on the left side of the processor board and the second HUB-conductive portion and the second processor-chip conductive portion are positioned on the right side of the processor board such that the left side of the processor board is symmetric with the right side of the processor board.

14. The printed circuit board of claim 8 further comprising:
- a first resistor conductive portion mounted on the left side of the processor board, the first resistor conductive portion being electrically coupled to the first processor-chip conductive portion; and
- a second resistor conductive portion mounted on the right side of the processor board, the second resistor conductive portion being electrically coupled to the second processor-chip conductive portion.

15. The printed circuit board of claim 14 further comprising:
- a first resistor mounted to the first resistor conductive portion; and
- a second resistor mounted to the second resistor conductive portion.

16. The printed circuit board of claim 15 wherein the first and second processor-chip conductive portions are positioned on a lower surface of the processor board, and the first and second HUB-conductive portions and first and second resistor conductive portions are positioned on an upper surface of the processor board.

17. A method of fabricating circuit boards comprising:
- forming a first HUB-chip conductive portion and a first processor-chip conductive portion on a left side of a processor board;
- forming a second HUB-chip conductive portion and a second processor-chip conductive portion on a right side of a processor board; and
- separating the left side of the processor board from the right side of the processor board to form a pair of circuit boards, wherein the first HUB-chip conductive portion and the first processor-chip conductive portion are formed on the left side of the processor board and the second HUB-chip conductive portion and the second processor-chip conductive portion are formed on the right side of the processor board such that the left side of the processor board is symmetric to the right side of the processor board thereby forming a pair of identical circuit boards when the left side of the processor board is separated from the right side of the processor board.

18. The method of claim 17 further comprising:
- coupling a first HUB the first HUB-chip conductive portion;
- coupling a second HUB the second HUB-chip conductive portion;
- coupling a first processor the first processor-chip conductive portion; and
- coupling a second processor the second processor-chip conductive portion.

19. The method of claim 17 wherein the first HUB-chip conductive portion is electrically coupled to the first processor-chip conductive portion as the first HUB-chip conductive portion and the first processor-chip conductive portion are formed on the left side of the processor board.

20. The method of claim 19 wherein the second HUB-chip conductive portion is electrically coupled to the second processor-chip conductive portion as the second HUB-chip conductive portion and the second processor-chip conductive portion are formed on the right side of the processor board.

* * * * *

UNITED STATES PATENT AND TRADEMARK OFFICE
CERTIFICATE OF CORRECTION

PATENT NO.     : 6,487,082 B1
DATED          : November 26, 2002
INVENTOR(S)    : Stephen A. Bowen et al.

It is certified that error appears in the above-identified patent and that said Letters Patent is hereby corrected as shown below:

Column 6,
Line 4, delete "," after "portion" and insert -- ; --, therefor.
Line 19, delete "curcuit" and insert -- circuit --, therefor.
Line 58, delete "," after "portion" and insert -- ; --, therefor
Line 60, delete "," after "board".

Column 8,
Line 11, delete "," after "boards" and insert -- ; --, therefor.

Signed and Sealed this

Twentieth Day of May, 2003

JAMES E. ROGAN
*Director of the United States Patent and Trademark Office*